US012656824B2

(12) United States Patent
Lee et al.

(10) Patent No.: US 12,656,824 B2
(45) Date of Patent: Jun. 16, 2026

(54) DISPLAY DEVICE

(71) Applicant: SAMSUNG DISPLAY CO., LTD., Yongin-si (KR)

(72) Inventors: Jeoung Sub Lee, Seoul (KR); Ji Eun Nam, Seoul (KR); Joo Hyeon Lee, Suwon-si (KR); Heon Jung Shin, Hwaseong-si (KR); Tae Hyeog Jung, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 118 days.

(21) Appl. No.: 17/450,868

(22) Filed: Oct. 14, 2021

(65) Prior Publication Data

US 2022/0231254 A1 Jul. 21, 2022

(30) Foreign Application Priority Data

Jan. 19, 2021 (KR) ........................ 10-2021-0007586

(51) Int. Cl.
*G06F 1/16* (2006.01)
*B32B 7/022* (2019.01)
(Continued)

(52) U.S. Cl.
CPC ............ *G06F 1/1652* (2013.01); *B32B 7/022* (2019.01); *B32B 7/12* (2013.01); *B32B 23/20* (2013.01);
(Continued)

(58) Field of Classification Search
None
See application file for complete search history.

(56) References Cited

U.S. PATENT DOCUMENTS 9,287,341 B2 3/2016 Cheon et al.
10,586,941 B2 3/2020 Lee et al.
(Continued)

FOREIGN PATENT DOCUMENTS

CN 106960849 A 7/2017
CN 107123370 A 9/2017
(Continued)

OTHER PUBLICATIONS

C. Schaller, College of Saint Benedict / Saint John's University, Advanced Polymer Chemistry Lecture Notes, https://www.employees.csbsju.edu/cschaller/Advanced/Polymers/CPtime.html (Year: 2022).*
(Continued)

*Primary Examiner* — Frank J Vineis
*Assistant Examiner* — Nicole T Gugliotta
(74) *Attorney, Agent, or Firm* — F. CHAU & ASSOCIATES, LLC

(57) ABSTRACT

A display device is provided. A display device including folding areas, the display device includes a display panel, a first protection member disposed on the display panel, a second protection member disposed on the first protection member, a first adhesive member disposed between the display panel and the first protection member, and a second adhesive member disposed between the first protection member and the second protection member and having an elastic modulus equal to or smaller than an elastic modulus of the first adhesive member.

19 Claims, 14 Drawing Sheets

(51) Int. Cl.

| | | |
|---|---|---|
| *B32B 7/12* | (2006.01) |
| *B32B 15/095* | (2006.01) |
| *B32B 15/20* | (2006.01) |
| *B32B 23/04* | (2006.01) |
| *B32B 23/20* | (2006.01) |
| *B32B 27/08* | (2006.01) |
| *B32B 27/28* | (2006.01) |
| *B32B 27/32* | (2006.01) |
| *B32B 27/34* | (2006.01) |
| *B32B 27/36* | (2006.01) |
| *B32B 27/40* | (2006.01) |
| *H10K 59/80* | (2023.01) |
| *H10K 102/00* | (2023.01) |
| *H10K 59/122* | (2023.01) |

(52) U.S. Cl.
CPC .............. *B32B 27/34* (2013.01); *B32B 27/36* (2013.01); *H10K 59/873* (2023.02); *B32B 2307/54* (2013.01); *B32B 2307/732* (2013.01); *B32B 2457/206* (2013.01); *H10K 59/122* (2023.02); *H10K 59/8722* (2023.02); *H10K 2102/311* (2023.02)

(56) References Cited

U.S. PATENT DOCUMENTS

| | | | |
|---|---|---|---|
| 10,603,876 | B2 | 3/2020 | Kwak et al. |
| 10,632,711 | B2 | 4/2020 | Lee et al. |
| 10,725,498 | B2 | 7/2020 | Han et al. |
| 11,183,651 | B2 | 11/2021 | Jung et al. |
| 11,451,652 | B2 | 9/2022 | Yan et al. |
| 2006/0044490 | A1 | 3/2006 | Ichioka et al. |
| 2015/0357395 | A1* | 12/2015 | Cheon ................ H01L 27/3276 257/89 |
| 2017/0293194 | A1 | 10/2017 | Hou et al. |
| 2018/0134007 | A1 | 5/2018 | Lee et al. |
| 2018/0354227 | A1* | 12/2018 | Park .......................... B32B 5/12 |
| 2019/0075688 | A1* | 3/2019 | Chen ...................... H10K 50/87 |
| 2019/0107866 | A1 | 4/2019 | Han et al. |
| 2019/0140199 | A1 | 5/2019 | Senoo et al. |
| 2025/0101193 | A1 | 3/2025 | Park et al. |

FOREIGN PATENT DOCUMENTS

| | | |
|---|---|---|
| CN | 108074490 A | 5/2018 |
| CN | 109080239 A | 12/2018 |
| CN | 109118963 A | 1/2019 |
| CN | 109135632 A | 1/2019 |
| CN | 111816077 A | 10/2020 |
| JP | 2012-088606 A2 | 5/2012 |
| KR | 10-2015-0142157 A | 12/2015 |
| KR | 10-2018-0055973 A | 5/2018 |
| KR | 10-2018-0136038 A | 12/2018 |
| KR | 10-2019-0040518 A | 4/2019 |
| KR | 10-2020888 | 9/2019 |
| KR | 10-2040299 | 11/2019 |
| KR | 10-2020-0049942 | 5/2020 |

OTHER PUBLICATIONS

Polymer Grafting and Crosslinking, Edited by Amit Bhattacharya, James W. Rawlins and Paramita Ray Copyright © 2009 by John Wiley & Sons, Inc. (Year: 2009).*

Partial European Search Report dated Jun. 10, 2022 in corresponding European Patent Application No. 22151524.0 (15 pages).

Office Action dated Sep. 19, 2024 in corresponding Korean Patent Application 10-2021-0007586, in Korean, 9 pages.

Office Action dated Nov. 4, 2025 in corresponding Chinese Patent Application 202210014883.6, in Chinese, 11 pages.

Second Office Action dated Apr. 29, 2026 in related Chinese Appln. No. 202210014883.6, 9 pages, in Chinese.

* cited by examiner

1

DA

NDA

NFA1

FDA1

NFA2

FDA2

NFA3

DR3

DR2

DR1

NFA: NFA1, NFA2, NFA3
FDA: FDA1, FDA2

NFA: NFA1, NFA2, NFA3
FDA: FDA1, FDA2

FIG. 8

NFA: NFA1, NFA2
FDA: FDA1

DISPLAY DEVICE

This application claims priority under 35 U.S.C. § 119 to Korean Patent Application No. 10-2021-0007586 filed on Jan. 19, 2021 in the Korean Intellectual Property Office, the contents of which in its entirety are herein incorporated by reference.

BACKGROUND

1. Field of the Disclosure

The present disclosure relates to a display device.

2. Description of the Related Art

As the information-oriented society evolves, various demands for display devices are ever increasing. For example, display devices are being employed by a variety of electronic devices such as smart phones, digital cameras, laptop computers, navigation devices, and smart televisions.

Recently, a foldable display device is getting a lot of attention. A foldable display device has the advantages of both a smart phone and a tablet PC because it is easy to carry and may have a wide screen. A protective film for such a foldable display device is desirable to have high durability in order to protect the elements in the display device, and to have high flexibility for smooth folding.

SUMMARY

Aspects of the present disclosure provide a display device including a protective film that has impact resistance as well as flexibility.

It should be noted that objects of the present disclosure are not limited to the above-mentioned object; and other objects of the present disclosure will be apparent to those skilled in the art from the following descriptions.

An embodiment of a display device including folding areas, the display device includes a display panel, a first protection member disposed on the display panel, a second protection member disposed on the first protection member, a first adhesive member disposed between the display panel and the first protection member, and a second adhesive member disposed between the first protection member and the second protection member and having an elastic modulus equal to or smaller than an elastic modulus of the first adhesive member.

An embodiment of a display device including a first folding area and a second folding area spaced apart from each other and extended in a first direction, the display device includes a display panel, a first protection member disposed on the display panel, a second protection member disposed on the first protection member and having a storage modulus increasing with a frequency of an external impact applied to the second protection member, a first adhesive member disposed between the display panel and the first protection member, and a second adhesive member disposed between the first protection member and the second protection member, wherein the display device is folded inward along the first folding area and folded outward along the second folding area.

An embodiment of a display device including a first folding area and a second folding area spaced apart from each other and extended in a first direction, the display device includes a display panel, a first protection member disposed on the display panel, a second protection member disposed on the first protection member, a first adhesive member disposed between the display panel and the first protection member, and a second adhesive member disposed between the first protection member and the second protection member, wherein a storage modulus of the first protection member lies in a range of from 1,000 MPa to 2,000 MPa at −20° C., and in a range of from 100 MPa to 2,000 MPa at 85° C.

According to an embodiment of the present disclosure, a protective film of a display device may have impact resistance as well as flexibility.

It should be noted that effects of the present disclosure are not limited to those described above and other effects of the present disclosure will be apparent to those skilled in the art from the following descriptions.

BRIEF DESCRIPTION OF THE DRAWINGS

The above and other aspects and features of the present disclosure will become more apparent by describing in detail embodiments thereof with reference to the attached drawings, in which:

FIG. 8 is a graph showing a relationship between the modulus of the second protection member and external impact according to an embodiment.

DETAILED DESCRIPTION OF THE EMBODIMENTS

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art.

It will also be understood that when a layer is referred to as being "on" another layer or substrate, it may be directly on the other layer or substrate, or intervening layers may also be present. The same reference numbers indicate the same components throughout the specification. In the attached figures, the thickness of layers and regions is exaggerated for clarity.

Although the terms "first", "second", etc. may be used herein to describe various elements, these elements, should not be limited by these terms. These terms may be used to distinguish one element from another element. Thus, a first element discussed below may be termed a second element without departing from teachings of one or more embodiments. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

Hereinafter, embodiments of the present disclosure will be described with reference to the accompanying drawings.

Figure 1:
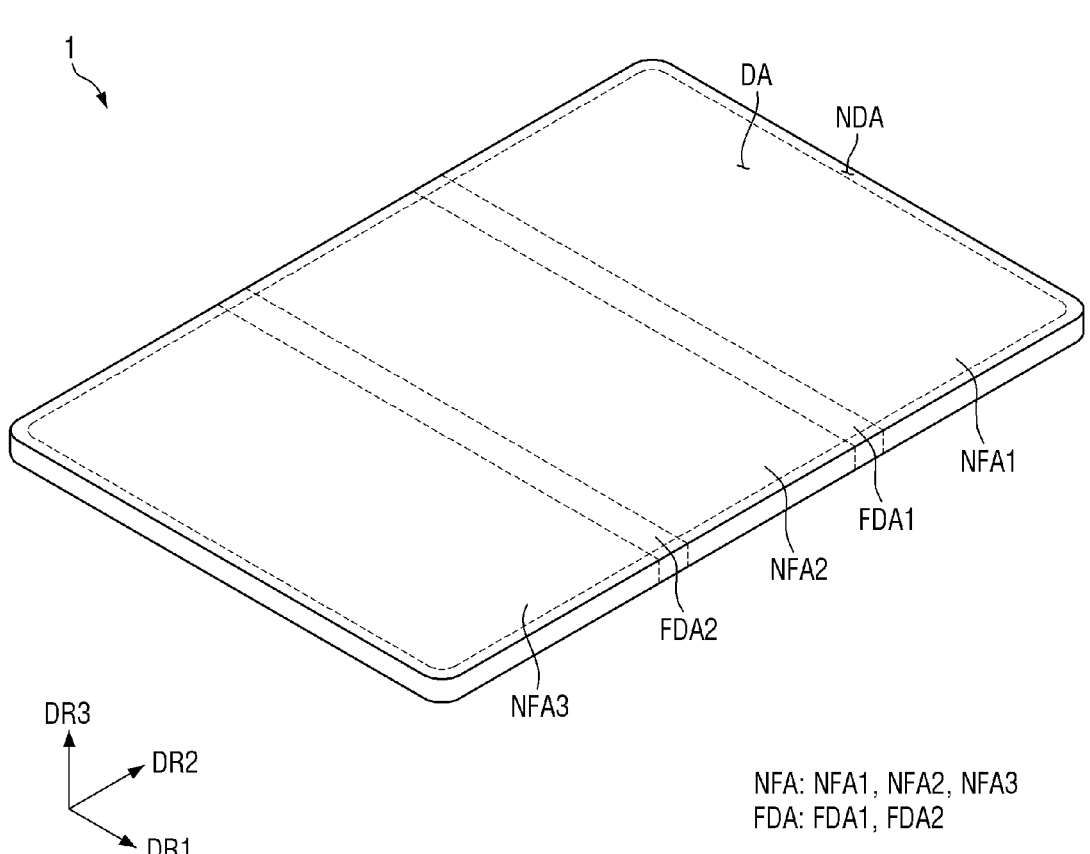
FIG. 1 is a perspective view of a display device according to an embodiment of the present disclosure when it is unfolded.
Figure 2:
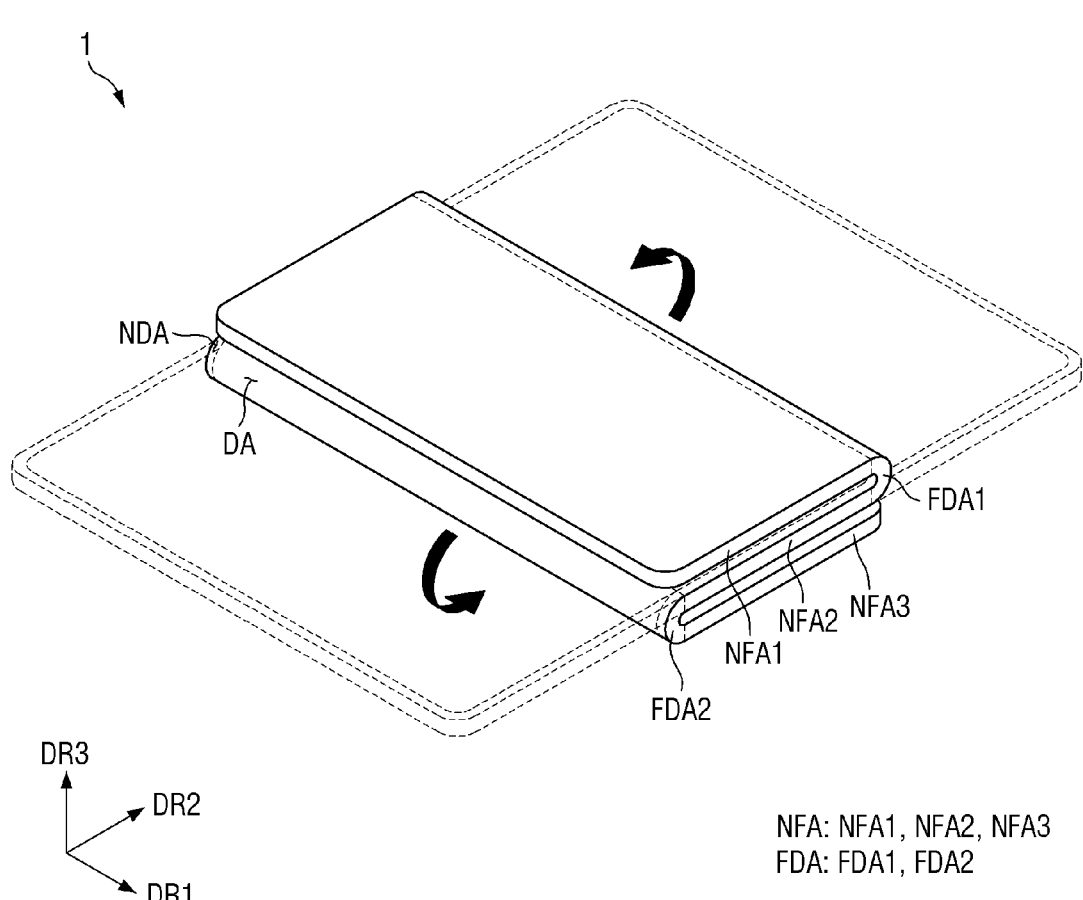
FIG. 2 is a perspective view of the display device according to the embodiment of the present disclosure when it is folded.

FIG. 1 is a perspective view of a display device according to an embodiment of the present disclosure when it is unfolded. FIG. 2 is a perspective view of the display device according to the embodiment of the present disclosure when it is folded. According to the embodiment shown in FIG. 2, the display device 1 is folded inward along a first folding area FDA1 and is folded outward along a second folding area FDA2.

Referring to FIGS. 1 and 2, a display device 1 according to the embodiment of the present disclosure displays images or videos in a display area DA to be described later, and may include a variety of devices including the display area DA. For example, the display device 1 according embodiments of the present disclosure may be applied to a mobile phone, a tablet PC, a personal digital assistant (PDA), a portable multimedia player (PMP), a television set, a game machine, a wristwatch-type electronic device, a head-mounted display, a personal computer monitor, a laptop computer, a car navigation system, a car instrument cluster, a digital camera, a camcorder, an outdoor billboard, an electronic billboard, various medical apparatuses, various home appliances such as a refrigerator and a laundry machine, Internet of things (IoT) devices, etc., in addition to a smart phone.

The display device 1 includes a display area DA and a non-display area NDA. The display area DA may be defined as an area for displaying images. The display area DA may include a plurality of pixels. The plurality of pixels may be arranged in a matrix. No image may be displayed in the non-display area NDA. When the display device 1 has touch features, the display device 1 may further include a touch area where a touch input is sensed, and the touch area may overlap with the display area DA. Although not limited thereto, the touch area may be substantially identical to the display area DA.

The shape of the display area DA may conform to the shape of the display device 1 employing the display area DA. The display area DA may have a rectangular shape having corners at the right angle or rounded corners when viewed from the top. It is to be understood that the shape of the display area DA when viewed from the top is not limited to the rectangle shown in the drawings, but may have other shapes such as a circle and an ellipse.

In the example shown in the drawings, the shorter sides of the rectangle of the display area DA are extended in the first direction DR1, and the longer sides thereof are extended in a second direction DR2 perpendicular to the first direction DR1. A third direction DR3 is perpendicular to the first direction DR1 as well as the second direction DR2, and may refer to the thickness direction of the display device 1. It should be understood that the directions referred to in the embodiments are relative directions, and the embodiments are not limited to the directions mentioned.

As used herein, the terms "top", "upper surface" and "upper side" in the third direction DR3 refer to the display side of a display panel 10, whereas the terms "bottom", "lower surface" and "lower" refer to the opposite side of the display panel 10, unless stated otherwise.

The non-display area NDA may surround the display area DA. The non-display area NDA may surround all sides of the display area DA, but the present disclosure is not limited thereto. The non-display area NDA may not be disposed near at least some of the four sides of the display area DA. The bezel area of the display device 1 may be formed as the non-display area NDA.

The display device 1 may be a foldable display device. As used herein, a foldable display device refers to a display device that is folded and has both a folded state and an unfolded state. When folded, the device is typically folded at an angle of approximately 180°. It is, however, to be understood that the present disclosure is not limited thereto. For example, when a device is folded at an angle greater than or less than 180°, e.g., at an angle of 90° or more but less than 180° or an angle of 120° or more and less than 180°, the device is also referred to as being folded. In addition, even when not completely folded, the device may be referred to as being folded if the device is not unfolded but is bent somewhat. For example, even if bent at an angle of 90 degrees or less, the device may be referred to as being folded in order to distinguish it from being unfolded as long as the maximum folding angle is 90 degrees or more.

The display device 1 may include folding areas FDA: FDA1 and FDA2 (or folding lines). The folding areas FDA may include a first folding area FDA1 and a second folding area FDA2 separated and spaced apart from each other. The first folding area FDA1 may be disposed on one side of the second folding area FDA2 in the second direction DR2.

Each of the folding areas FDA may be extended in a direction parallel to one side of the display device 1. For example, each of the folding areas FDA may be extended in a direction in which the shorter sides of the display device 1 are extended (first direction DR1). In the display device 1 in a rectangular shape having the sides extended in the second direction DR2 longer than the sides extended in the first direction DR1, when the folding areas FDA are extended in the first direction DR1 as in the example shown in the drawings, the longer sides (the sides extended in the second direction DR2) of the display device 1 may be reduced to half or less while the shorter sides (the sides extended in the first direction DR1) may remain the same after the display device 1 has been folded. In an embodiment, the folding areas FDA may be extended in the same direction (the second direction DR2) as the direction of the longer sides (the sides extended in the second direction DR2).

Each of the folding areas FDA may have a predetermined width in the second direction DR2. The width of each of the folding areas FDA in the second direction DR2 may be smaller than the width thereof in the first direction DR1.

The display device 1 may be folded over the folding areas FDA. The design of a foldable display device may be sorted into in-folding design in which the display surface of the display device 1 is folded inward, and out-folding design in which the display surface thereof is folded outward. The display device 1 may have either the in-folding design or the out-folding design, or may have in-and-out-folding design. For a display device having the in-and-out-folding design, the device may be folded inward and outward along the same folding area FDA or may be folded inward and outward along different folding areas, respectively. According to the embodiment shown in FIG. 2, the display device 1 is folded inward along the first folding area FDA1 and is folded outward along the second folding area FDA2.

The display device 1 may include non-folding areas NFA disposed near the folding areas FDA. The non-folding areas NFA may include a first non-folding area NFA1 located on one side of the first folding area FDA1 in the second direction DR2, a second non-folding area NFA2 located on the opposite side of the first folding area FDA1 in the second direction DR2, and a third non-folding area NFA3 located on the opposite side of the second folding area FDA2 in the second direction DR2. The second non-folding area NFA2 may be disposed between the first folding area FDA1 and the second folding area FDA2. The first non-folding area NFA1 may be disposed on one side of the second non-folding area NFA2 in the second direction DR2 with the first folding area FDA1 therebetween. The third non-folding area NFA3 may be disposed on the opposite side of the second non-folding area NFA2 in the second direction DR2 with the second folding area FDA2 therebetween.

The first non-folding area NFA1, the second non-folding area NFA2 and the third non-folding area NFA3 may have the same width in the second direction DR2. Depending on the positions of the folding areas FDA, the width of the first non-folding area NFA1 in the second direction DR2, the width of the second non-folding area NFA2 in the second direction DR2, and the width of the third non-folding area NFA3 in the second direction DR2 may be different from one another.

The display area DA and the non-display area NDA of the display device 1 may overlap the folding areas FDA and the non-folding areas NFA at the same locations. For example, a part of the display area DA may be in the non-folding area NFA, and another part of the display area DA may be in the folding area FA. For example, a part of the non-display area NDA may be in the non-folding area NFA, and another part of the non-display area NDA may be in the folding area FA. For example, a certain location of the display area DA may be in the first non-folding area NFA1. Another location of the non-display area NDA may be in the first non-folding area NFA1. Another location of the display area DA may be in the folding areas FDA.

The display area DA may be disposed across all of the first non-folding area NFA1, the second non-folding area NFA2, and the third non-folding area NFA3. The display area DA may also be located at the first folding area FDA1 which is disposed between the first non-folding area NFA1 and the second non-folding area NFA2, and at the second folding area FDA2 which is disposed between the second non-folding area NFA2 and the third non-folding area NFA3. The display area DA of the display device 1 may be continuously disposed irrespective of the boundaries between the non-folding areas NFA and the folding lines FDA, etc. It is, however, to be understood that the present disclosure is not limited thereto. The display area DA may be located only at one of the first non-folding area NFA1, the second non-folding area NFA2 and the third non-folding area NFA3, or the display area DA may be disposed in the first non-folding area NFA1, the second non-folding area NFA2 and the third non-folding area NFA3 but not in the folding areas FDA.

Figure 3:
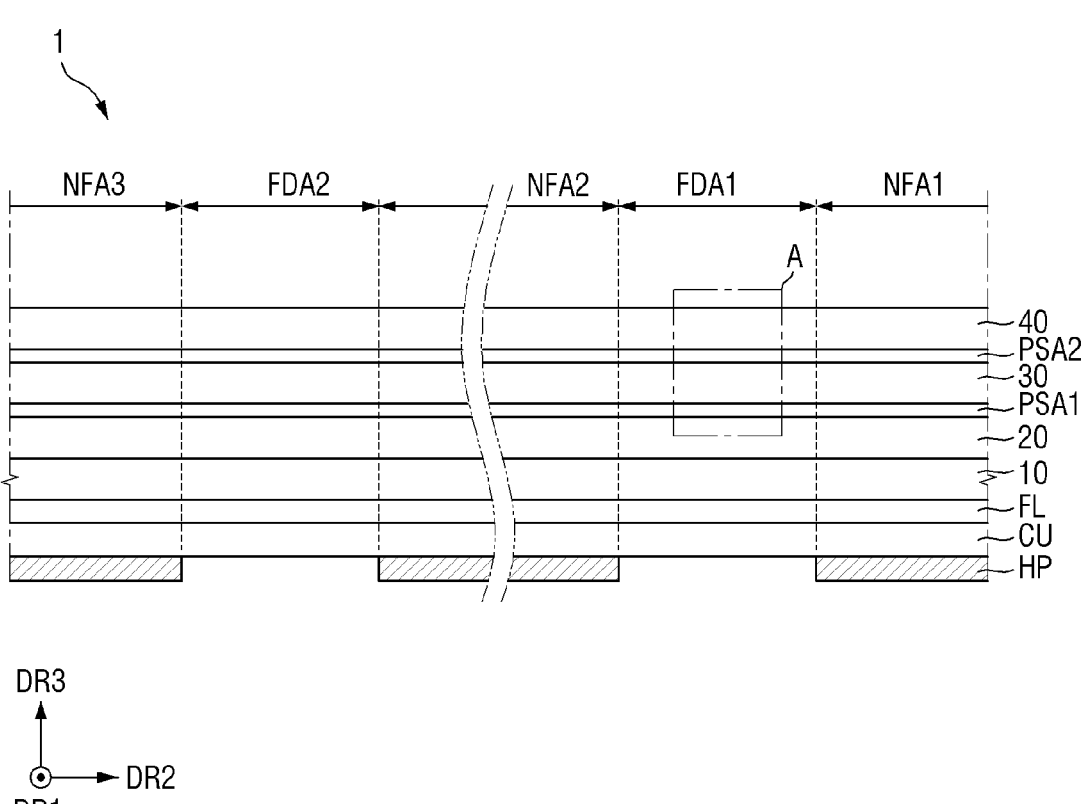
FIG. 3 is a cross-sectional view of a display device according to an embodiment of the present disclosure when the display device is unfolded.
Figure 4:
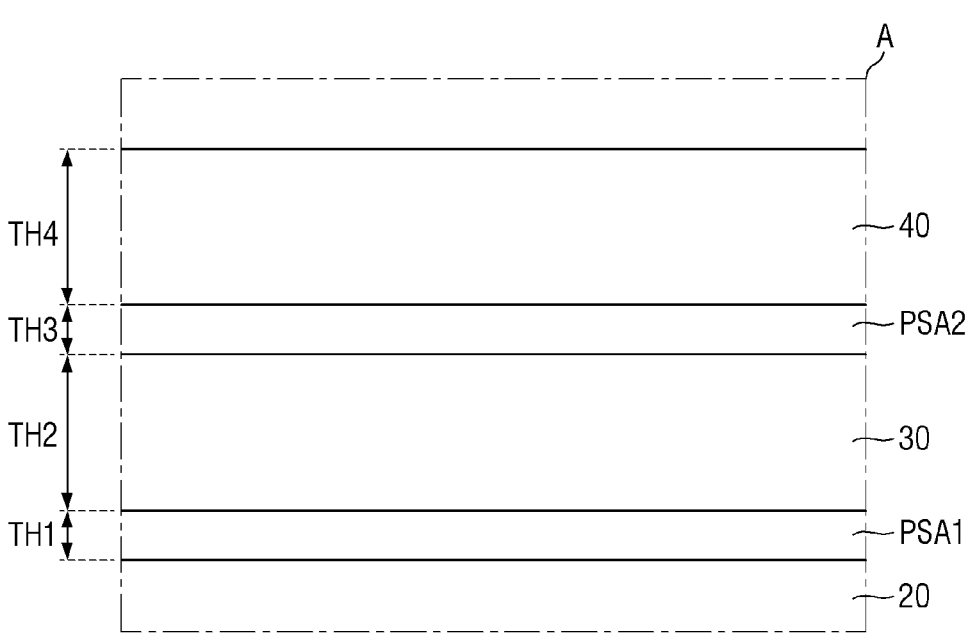
FIG. 4 is an enlarged view of area A of FIG. 3.
Figure 5:
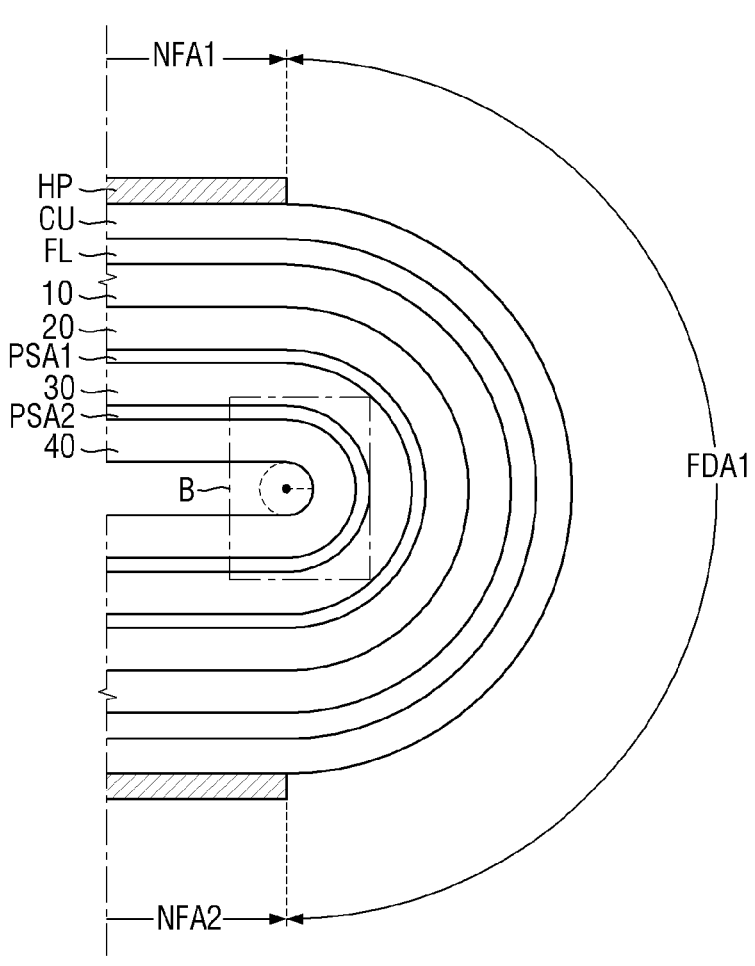
FIG. 5 is a cross-sectional view of a display device according to an embodiment when the display device is folded inward at the first folding area.
Figure 5:
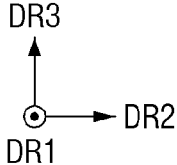
Figure 6:
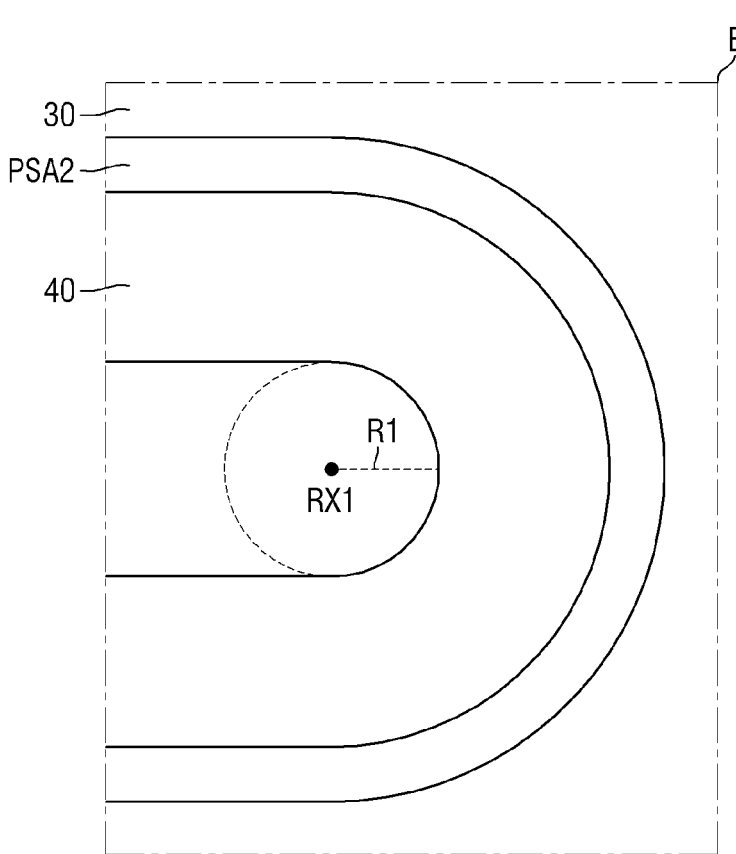
FIG. 6 is an enlarged view of area B of FIG. 5.
Figure 7:
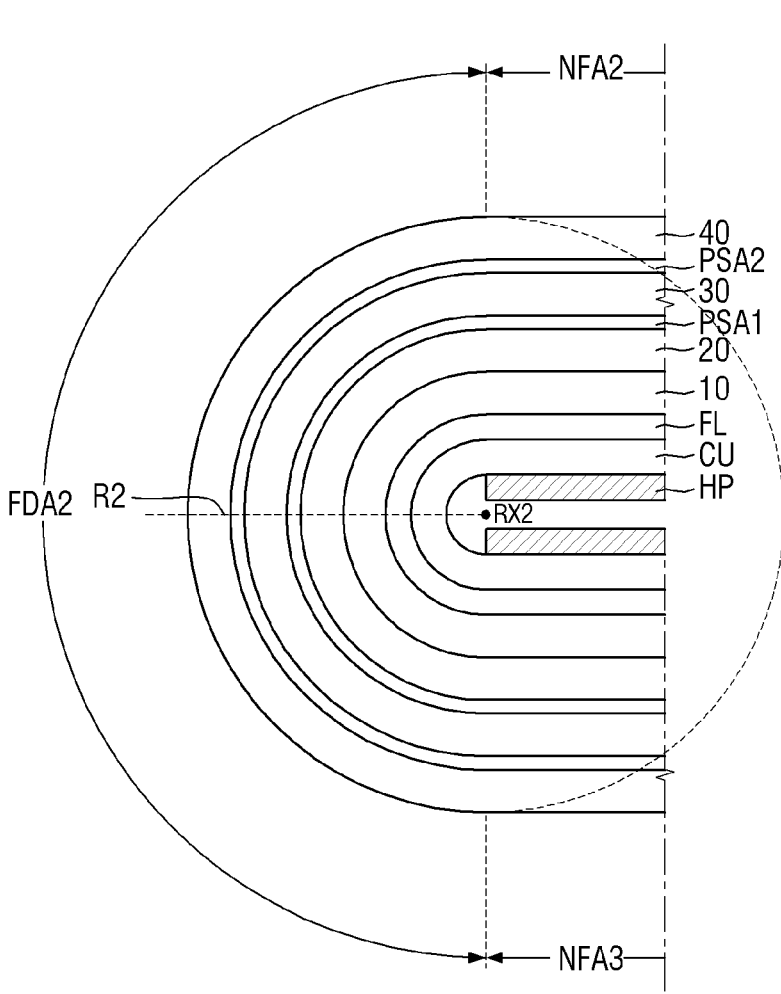
FIG. 7 is a cross-sectional view of the display device according to the embodiment when the display device is folded outward at the second folding area.
Figure 7:
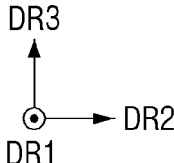

FIG. 3 is a cross-sectional view of a display device according to an embodiment of the present disclosure when the display device is unfolded. FIG. 4 is an enlarged view of area A of FIG. 3. FIG. 5 is a cross-sectional view of a display device according to an embodiment when the display device is folded inward at the first folding area. FIG. 6 is an enlarged view of area B of FIG. 5. FIG. 7 is a cross-sectional view of the display device according to the embodiment when the display device is folded outward at the second folding area.

Referring to FIGS. 3 to 7, the display device 1 may include a display panel 10, an anti-reflection member 20, a first adhesive member PSA1, a first protection member 30, a second adhesive member PSA2, and a second protection member 40 sequentially stacked on one side of the display panel 10 in the thickness direction (the third direction DR3). The display device 1 may further include a polymer film layer FL, a cushion layer CU, and a heat dissipation member HP sequentially stacked on the opposite side of the display panel 10 in the thickness direction (the third direction DR3). It is, however, to be understood that the present disclosure is not limited thereto. Another layer may be further disposed between the layers, and some of the elements stacked on one another may be eliminated. Not only between the anti-reflection member 20 and the first protection member 30 and between the first protection member 30 and the second protection member 40, but also between the elements stacked on one another, at least one coupling member such as an adhesive layer and a detachable layer may be disposed to couple the adjacent elements stacked on one another.

The display panel 10 displays images or videos. Examples of the display panel 10 may include a self-luminous display panel such as an organic light-emitting display panel, an inorganic light-emitting display panel, a quantum-dot light-emitting display panel, a micro LED display panel, a nano LED display panel, a plasma display panel, a field emission display panel and a cathode ray display panel, as well as a light-receiving display panel such as a liquid-crystal display panel and an electrophoretic display panel. In the following description, the organic light-emitting display panel will be described as an example of the display panel 10, and the organic light-emitting display panel will be referred to as the display panel 300 unless specifically stated otherwise. It is, however, to be understood that the embodiments of the present disclosure are not limited to the organic light-emitting display panel, and any other display panel listed above or well known in the art may be employed without departing from the scope of the present disclosure. The structure of the display panel 10 will be described in more detail later.

The anti-reflection member 20 may be disposed on the display panel 10. The anti-reflection member 20 may reduce reflection of external light. The anti-reflection member 20 may be implemented as a polarizing film. The anti-reflection member 20 polarizes the light passing therethrough. It is, however, to be understood that the present disclosure is not limited thereto. The anti-reflection member 20 may be implemented as a color filter layer in the display panel 10.

The first protection member 30 may be disposed above the anti-reflection member 20. The first protection member 30 serves to cover and protect the display panel 10. The first protection member 30 may have flexibility and thus may be curved, bent, folded, or rolled. The first protection member 30 may include or may be formed of polyether block amide (PEBA). It is, however, to be understood that the present disclosure is not limited thereto. The first protection member 30 may include or may be formed of at least one selected from the group consisting of: polyurethane, silicone, pentaerythritol triacrylate (PETA), and copolyester elastomers (COPE).

The first protection member 30 may be made of a transparent material. The first protection member 30 may include or may be formed of, for example, glass or plastic. When the first protective member 30 includes or is formed of glass, the glass may be ultra thin glass (UTG) or thin glass. When the first protection member 30 includes or is formed of plastic, the plastic may be, but is not limited to, a transparent polyimide.

The storage modulus of the first protection member 30 may be greater than 0 MPa (megapascal) and equal to or less than 9,000 MPa at −20° C. In some embodiments, the storage modulus of the first protection member 30 may be in the range of from 25 MPa to 5,000 MPa at −20° C. In some embodiments, the storage modulus of the first protection member 30 may be in the range of from 25 MPa to 2,000 MPa at −20° C. In some embodiment, the storage modulus of the first protection member 30 may be in the range of from 1,000 MPa to 2,000 MPa at −20° C. The storage modulus of the first protection member 30 may be in the range of from 100 MPa to 9,000 MPa at 85° C. In some embodiments, the storage modulus of the first protection member 30 may be in the range of from 100 MPa to 5,000 MPa at 85° C. In some embodiments, the storage modulus of the first protection member 30 may be in the range of from 100 MPa to 2,000 MPa at 85° C. In some embodiments, the storage modulus of the first protection member 30 may be in the range of from 1,000 MPa to 2,000 MPa at 85° C.

When the storage modulus of the first protection member 30 satisfies the above ranges, the display device 1 may have sufficient flexibility even when the display device 1 is folded inward at the first folding area FDA1 and is folded outward at the second folding area FDA2, facilitating in-folding of the display device 1 as well as out-folding thereof.

The storage modulus of the first protection member 30 may be measured by, but is not limited to, dynamic mechanical analysis (DMA).

The first protection member 30 may have a second thickness TH2. For example, the second thickness TH2 may refer to the thickness in the thickness direction (the third direction DR3) of the first protection member 30, and the first protection member 30 has the second thickness TH2. The second thickness TH2 may be, but is not limited to, in the range of from 0.01 μm to 400 μm. In some embodiment, the second thickness TH2 may be in the range of from 0.1 μm to 100 μm. In some embodiment, the second thickness TH2 may be in the range of from 1 μm to 40 μm.

The first adhesive member PSA1 may be disposed between the first protection member 30 and the anti-reflection member 20. The first protection member 30 and the anti-reflection member 20 may be attached together by the first adhesive member PSA1. The first adhesive member PSA may include, but is not limited to, a pressure sensitive adhesive or an adhesive. The first adhesive member PSA1 may be optically transparent.

The first adhesive member PSA1 may have a first thickness TH1. For example, the first thickness TH1 may refer to the thickness of the first adhesive member PSA1 in the thickness direction (the third direction DR3), and the first adhesive member PSA1 may have the first thickness TH1. The first thickness TH1 may be, but is not limited to, in the range of from 0.01 μm to 100 μm. In some embodiments, the first thickness TH1 may be in the range of from 0.1 μm to 50 μm. In some embodiments, the first thickness TH1 may be in the range of from 1 μm to 25 μm.

The second protection member 40 may be disposed above the first protection member 30. The second protection member 40 may serve to protect the display panel 10 together with the first protection member 30. The second protection member 40 may have flexibility and thus may be curved, bent, folded, or rolled.

The second protection member 40 may include or may be formed of a polymer film. The second protection member 40 may include or may be formed of at least one selected from the group consisting of: polyethylene terephthalate (PET), tri-acetyl cellulose (TAC), transparent polyimide, and aramid.

When the display device 1 is folded inward at the first folding area FDA1, the display device 1 may be folded along the first folding axis RX1. When the display device 1 is folded inward at the first folding area FDA1, a first radius of curvature R1 of the second protection member 40 at the first folding area FDA1 may be, for example, in the range of from 0.01 mm to 5.0 mm, or in the range of from 0.1 mm to 1.0 mm. It is, however, to be understood that the present disclosure is not limited thereto. The first radius of curvature R1 may refer to a radius of curvature formed by the inner surface of the second protection member 40 at the first folding area FDA1 when the display device 1 is folded inward at the first folding area FDA1. The first radius of curvature R1 may be refer to a radius of curvature formed by the upper surface of the second protection member 40 disposed on the inner side when the display device 1 is folded inward as shown in FIGS. 4 and 5.

When the display device 1 is folded outward at the second folding area FDA2, the display device 1 may be folded along the second folding axis RX2. When the display device 1 is folded outward at the second folding area FDA2, a second radius of curvature R2 of the second protection member 40 at the second folding area FDA2 may be, for example, in the range of from 0.01 mm to 10.0 mm, or in the range of from 0.1 mm to 4.0 mm. It is, however, to be understood that the present disclosure is not limited thereto. The second radius of curvature R2 of the second protection member 40 may be greater than the first radius of curvature R1. The second radius of curvature R2 may refer to a radius of curvature formed by the outer surface of the second protection member 40 at the second folding area FDA2 when the display device 1 is folded outward at the second folding area FDA2. The second radius of curvature R2 may be refer to a radius of curvature formed by the upper surface of the second protection member 40 disposed on the outer side when the display device 1 is folded outward as shown in FIG. 6.

The second protection member 40 may have a fourth thickness TH4. For example, the fourth thickness TH4 may refer to the thickness in the thickness direction (the third direction DR3) of the second protection member 40, and the second protection member 40 has the fourth thickness TH4. The fourth thickness TH4 of the second protection member 40 may be greater than the second thickness TH2 of the first protection member 30, but is not limited to such. The fourth thickness TH4 may be, but is not limited to, in the range of from 0.01 μm to 500 μm, in the range of from 0.1 μm to 100 μm, or in the range of from 1 μm to 50 μm.

The second protection member 40 includes or is formed of a material having a storage modulus that varies according to an external impact, and thus the modulus of the second protection member 40 may vary according to an external impact. When the display device 1 is folded inward as well as outward, the modulus of the second protection member 40 may vary according to an external impact, and thus, both flexibility and impact resistance may be obtained.

Figure 8:
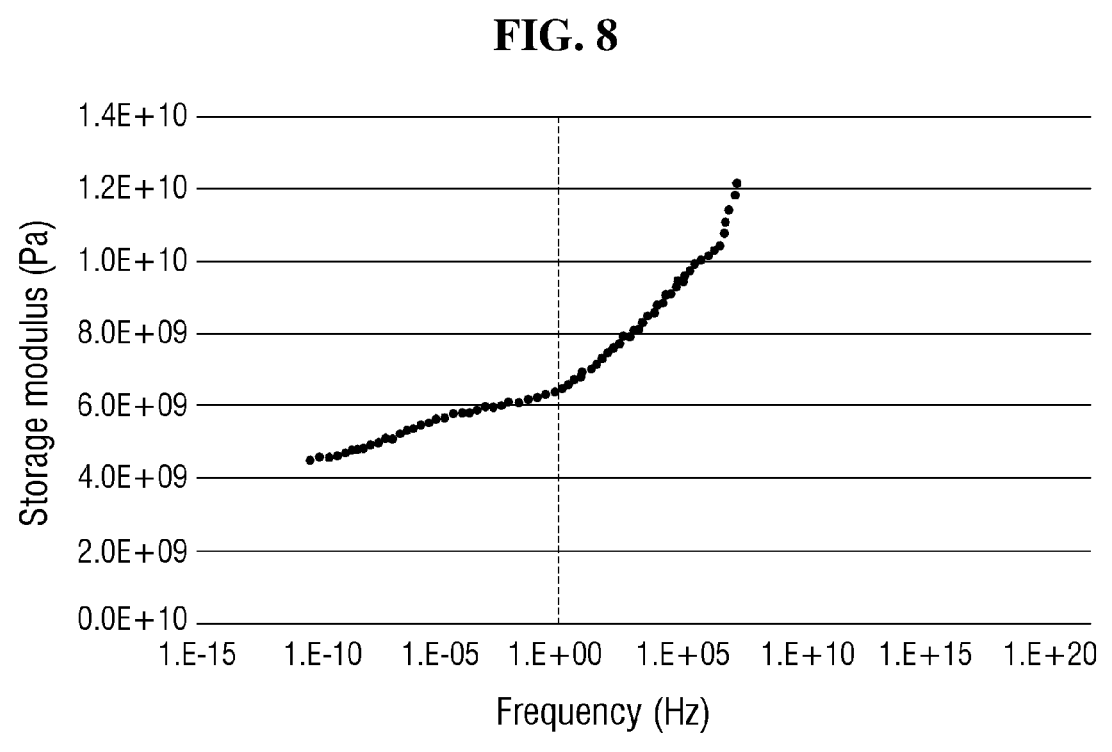

FIG. 8 is a graph showing a relationship between the storage modulus of the second protection member 40 and external impact according to an embodiment. The horizontal axis (x-axis) of the graph shown in FIG. 8 represents the frequency (Hz) of a sinusoidal load applied as the external impact to the second protection member 40, and the vertical axis (y-axis) represents the storage modulus.

Referring to FIG. 8, the storage modulus of the second protection member 40 may vary according to the frequency. The storage modulus of the second protection member 40 may increase as the frequency increases.

In the graph of the storage modulus of the second protection member 40 according to the frequency of the second protection member 40, the slope may be changed with respect to the frequency of 1 Hz. For example, the slope in the graph of the storage modulus of the second protection member 40 according to the frequency of the second protection member 40 is greater when the frequency is greater than 1 Hz than when the frequency is less than 1 Hz. The storage modulus of the second protection member 40 increases as the frequency of the external impact applied to the second protection member 40 increases, and the storage modulus may increase more according to the increase in frequency when the frequency is greater than 1 Hz than when the frequency is less than 1 Hz.

At a frequency which is equal to or greater than 1 Hz, it may be regarded that an external impact is applied to the second protection member 40. When an external impact with a frequency of 1 Hz or more is applied to the second protection member 40, the storage modulus may increase, and the larger the external impact is, the more the storage modulus of the second protection member 40 may increase.

For example, when the frequency of the external impact applied to the second protection member 40 is 1 Hz, the storage modulus of the second protection member 40 may be greater than 6 gigapascal (GPa). When the frequency of the external impact applied to the second protection member 40 is 30,000 Hz, the storage modulus of the second protection member 40 may be greater than 8 GPa. Specifically, when the frequency of the external impact applied to the second protection member 40 is 1 Hz, the storage modulus of the second protection member 40 may be in the range of from 6 GPa to 1,000 GPa, or may be in the range of from 6 GPa to 100 GPa. When the frequency of the external impact applied to the second protection member 40 is 30,000 Hz, the storage modulus of the second protection member 40 may be in the range of from 8 GPa to 1,000 GPa, or may be in the range of from 8 GPa to 100 GPa. It is, however, to be understood that the storage modulus of the second protection member 40 is not limited thereto.

Even if an external impact is applied to the second protection member 40 and the storage modulus has increased, after the impact is gone, the storage modulus of the second protection member 40 may be restored to the original value before the external impact was applied. It is, however, to be understood that the present disclosure is not limited thereto.

The storage modulus according to the frequency of the second protection member 40 may be measured by dynamic mechanical analysis (DMA), but the present disclosure is not limited thereto.

As the storage modulus of the second protection member 40 increases due to an external impact, the second protection member 40 may have both flexibility and impact resistance against external impact. For example, when the display device 1 is folded inward at the first folding area FDA1, the second protection member 40 may have flexibility at the first folding area FDA with a relatively low modulus. At the same time, when the display device 1 is folded outward at the second folding area FDA2 and an external impact is applied to that area, the storage modulus may increase and impact resistance may be obtained in that area. Accordingly, even though the display device 1 is folded inward and outward, the second protection member 40 may have both flexibility and impact resistance.

Referring again to FIGS. 3 to 7, the second adhesive member PAS2 may be disposed between the second protection member 40 and the first protection member 30. The second protection member 40 and the first protection member 30 may be attached together by the second adhesive member PSA2. The second adhesive member PSA2 may include or may be formed of, but is not limited to, a pressure sensitive adhesive or an adhesive. The second adhesive member PSA2 may include or may be formed of, but is not limited to, the same material as the first adhesive member PSA1. The second adhesive member PSA2 may be optically transparent.

The second adhesive member PSA2 may have a third thickness TH3. For example, the third thickness TH3 may refer to the thickness of the first adhesive member PSA1 in the thickness direction (the third direction DR3), and the second adhesive member PSA2 may have the third thickness TH3. The third thickness TH3 may be substantially equal to the first thickness TH1 of the first adhesive member PSA1, but the present disclosure is not limited thereto.

The elastic modulus of the second adhesive member PSA2 may be equal to or smaller than the elastic modulus of the first adhesive member PSA1. Although not limited thereto, for example, the elastic modulus of the first adhesive member PSA1 may be greater than 0 kPa (kilopascal) and less than 1,500 kPa at −20° C. In some embodiment, the elastic modulus of the first adhesive member PSA1 may be greater than 0 kPa and less than 750 kPa at −20° C. In some embodiment, the elastic modulus of the first adhesive member PSA1 may be greater than 0 kPa and less than 150 kPa at −20° C. The elastic modulus of the second adhesive member PSA2 may be greater than 0 kPa (kilopascal) and less than 1,000 kPa −20° C. In some embodiment, the elastic modulus of the second adhesive member PSA2 may be greater than 0 kPa and less than 500 kPa −20° C. In some embodiment, the elastic modulus of the second adhesive member PSA2 may be greater than 0 kPa and less than 100 kPa at −20° C.

When the elastic modulus of the first adhesive member PSA1 and the elastic modulus of the second adhesive member PSA2 are within the above ranges, and the elastic modulus of the second adhesive member PSA2 is equal to or less than that of the first adhesive member PSA1, it is possible to have the impact resistance in the out-folding area while having flexibility in the in-folding area even when the display device 1 is folded inward and outward at the different areas. In other words, as the second adhesive member PSA2 having a relatively small elastic modulus is disposed between the first protection member 30 and the second protection member 40, the impact resistance against external impact may be improved. As the first adhesive member PSA1 having a relatively large elastic modulus is disposed between the anti-reflection member 20 and the first protection member 30, the flexibility may be improved.

TABLE 1

| | Elastic modulus of second adhesive member (kPa) | Elastic modulus of first adhesive member (kPa) | Folding strain of second protection member (%) | Folding strain of the first protection member (%) |
|---|---|---|---|---|
| Comparative Example 1 | 140 | 97 | 1.6 | 5.3 |
| Comparative Example 2 | 140 | 109 | 1.7 | 4.7 |
| Example 1 | 140 | 140 | 1.5 | 4.6 |
| Comparative Example 3 | 109 | 97 | 1.6 | 5.2 |
| Example 2 | 109 | 109 | 1.5 | 4.5 |
| Example 3 | 109 | 140 | 1.5 | 4.4 |
| Comparative Example 4 | 97 | 97 | 1.8 | 4.3 |
| Example 4 | 97 | 109 | 1.7 | 3.6 |
| Example 5 | 97 | 140 | 1.7 | 3.5 |

TABLE 2

| | Elastic modulus of second adhesive member (kPa) | Elastic modulus of first adhesive member (kPa) | Folding strain of second protection member (%) | Folding strain of the first protection member (%) |
|---|---|---|---|---|
| Comparative Example 5 | 140 | 97 | 2.3 | 7.9 |
| Comparative Example 6 | 140 | 109 | 2.2 | 7.1 |
| Example 6 | 140 | 140 | 2.2 | 6.9 |
| Comparative Example 7 | 109 | 97 | 2.3 | 7.8 |
| Example 7 | 109 | 109 | 2.2 | 6.9 |
| Example 8 | 109 | 140 | 2.2 | 6.7 |
| Comparative Example 8 | 97 | 97 | 2.4 | 6.3 |
| Example 9 | 97 | 109 | 2.3 | 5.1 |
| Example 10 | 97 | 140 | 2.3 | 4.9 |

Tables 1 and 2 show the folding strains of the first protection member 30 and the second protection member 40 measured at the time of in-folding according to the elastic modulus of the first adhesive member PSA1 and the elastic modulus of the second adhesive member PSA2 at −20° C. and 85° C., respectively. The thickness of the second protection member 40 is 50 μm, and the second protection member 40 includes or is formed of optically transparent polyimide. Further, the thickness of the first protection member 30 is 75 μm, and the first protection member 30 includes or is formed of pentaerythritol triacrylate (PETA).

In Table 1, each of the elastic modulus of the first adhesive member PSA1 and the elastic modulus of the second adhesive member PSA2 is measured by a universal testing machine (UTM) at −20° C. In Table 2, each of the elastic modulus of the first adhesive member PSA1 and the elastic modulus of the second adhesive member PSA2 is measured by a universal testing machine (UTM) at −85° C.

When the folding strain (%) of the second protection member 40 is less than or equal to 2.3%, and the folding strain (%) of the first protection member 30 is equal to or less than 7.0%, the folding characteristics may be maintained, and the mechanical stability of the display device 1 may be maintained no matter how many times the second protection member 40 is repeatedly folded. In other words, when the folding strain of the second protection member 40 and the folding strain of the first protection member 30 are within the above ranges, it is possible to suppress or prevent the deterioration of the folding performance of the first protection member 30 and the second protection member 40 no matter how many times the display device 1 is repeatedly folded.

When the folding strain of the second protection member 40 and the folding strain of the first protection member 30 are within the above ranges, it is possible to suppress or prevent defects such as buckling between adjacent layers stacked on one another.

In Examples 1 to 10, the elastic modulus of the second adhesive member PSA2 is less than 150 kPa, the elastic modulus of the first adhesive member PSA1 is less than 100 kPa, and the elastic modulus of the second adhesive member PSA2 is equal to or smaller than the elastic modulus of the adhesive member PSA1. In Comparative Examples 1 to 8, the elastic modulus of the second adhesive member PSA2 is less than 150 kPa, the elastic modulus of the first adhesive member PSA1 is less than 100 kPa, and the elastic modulus of the second adhesive member PSA2 is greater than the elastic modulus of the adhesive member PSA1.

Comparing Examples to Comparative Examples, when the elastic modulus of the second adhesive member PSA2 is less than 150 kPa, the elastic modulus of the first adhesive member PSA1 is less than 100 kPa, and the elastic modulus of the second adhesive member PSA2 is equal to or smaller than the elastic modulus of the adhesive member PSA1, the folding strain of the second protection member 40 and the folding strain of the first protection member 30 are reduced more than when the elastic modulus of the second adhesive member PSA2 is greater than that of the first adhesive member PSA1. Accordingly, the folding performance of the first protection member 30 and the second protection member 40 may be maintained more reliably. In addition, when the folding strain of the second protection member 40 and the folding strain of the first protection member 30 are reduced, it is possible to suppress or prevent defects such as buckling between adjacent layers stacked on one another more effectively.

In the Examples, when the elastic modulus of the second adhesive member PSA2 is smaller than that of the first adhesive member PSA1, the folding strain of the second protection member 40 and the folding strain of the first protection member 30 are reduced more when the elastic modulus of the second adhesive member PSA2 is equal to that of the first adhesive member PSA1.

Although not shown in the drawings, a hard coating layer may be further disposed on the second protection member 40. The hard coating layer may protect the surface of the second protection member 40. For example, the hard coating layer may perform at least one of functions of anti-scattering when the second protection member 40 is broken, shock absorption, anti-scratch, anti-fingerprint, and anti-glare.

The polymer film layer FL may be disposed under the display panel 10. The polymer film layer FL may include or may be formed of, for example, polyimide (PI), polyethylene terephthalate (PET), polycarbonate (PC), polyethylene (PE), polypropylene (PP), polysulfone (PSF), polymethyl methacrylate (PMMA), triacetyl cellulose (TAC), or cycloolefin polymer (COP). The polymer film layer FL may include a functional layer on at least one surface. The functional layer may include or may be formed of, e.g., a light-absorbing layer. The light-absorbing layer may include or may be formed of a light-absorbing material such as a black pigment and dye. The light-absorbing layer may be formed on a polymer film by coating or printing a black ink.

The cushion layer CU may be disposed under the polymer film layer FL. The cushion layer CU may increase durability against impacts that may be exerted in the thickness direction (third direction DR3) of the display device 1, and may mitigate impact on the display device 1 when it is dropped. The cushion layer CU may include or may be formed of polyurethane or the like.

The heat dissipation member HP may be disposed under the polymer film layer FL. The heat dissipation member HP serves to diffuse heat generated from the display panel 10 or other elements of the display device 1. The heat dissipation member HP may include a metal plate. The metal plate may include or may be formed of, for example, metal having excellent thermal conductivity such as copper and silver. The heat dissipation member HP may include a heat dissipation sheet including graphite, carbon nanotubes, etc.

In order to facilitate folding of the display device 1, some layers of the display device 1 may be separated into individual ones at the folding area FDA. For example, the heat dissipation member HP forming the bottom layer of the display device 1 and having a small flexibility may be separated into two individual heat dissipation members disposed at the first folding area FDA1 and the second folding area FDA2, respectively.

For example, each of the cushion layer CU and the polymer film layer FL may also be separated into two individual ones at the first folding area FDA1 and the second folding area FDA2, respectively. However, if they have enough flexibility, they may be continuously extended on the folding areas FDA and the non-folding areas NFA.

When the display device 1 is folded inward along the first folding area FDA1 as shown in FIG. 5, the second non-folding area NFA2 may overlap the first non-folding area NFA1 in the thickness direction. When the display device 1 is folded outward along the second folding area FDA2 as shown in FIG. 7, the second non-folding area NFA2 may overlap the third non-folding area NFA3 in the thickness direction.

Unlike the separated heat dissipation member HP, the display panel 10, the polymer film layer FL, cushion layer CU, the anti-reflection member 20, the first protection member 30 and the second protection member 40, which are continuous example regardless of the folding areas FDA, may be curved along the width direction of the first folding area FDA1 and the second folding area FDA2 to form a curve in the cross section.

Hereinafter, a stack structure of the display panel 10 according to an embodiment will be described in detail with reference to FIG. 9.

Figure 9:
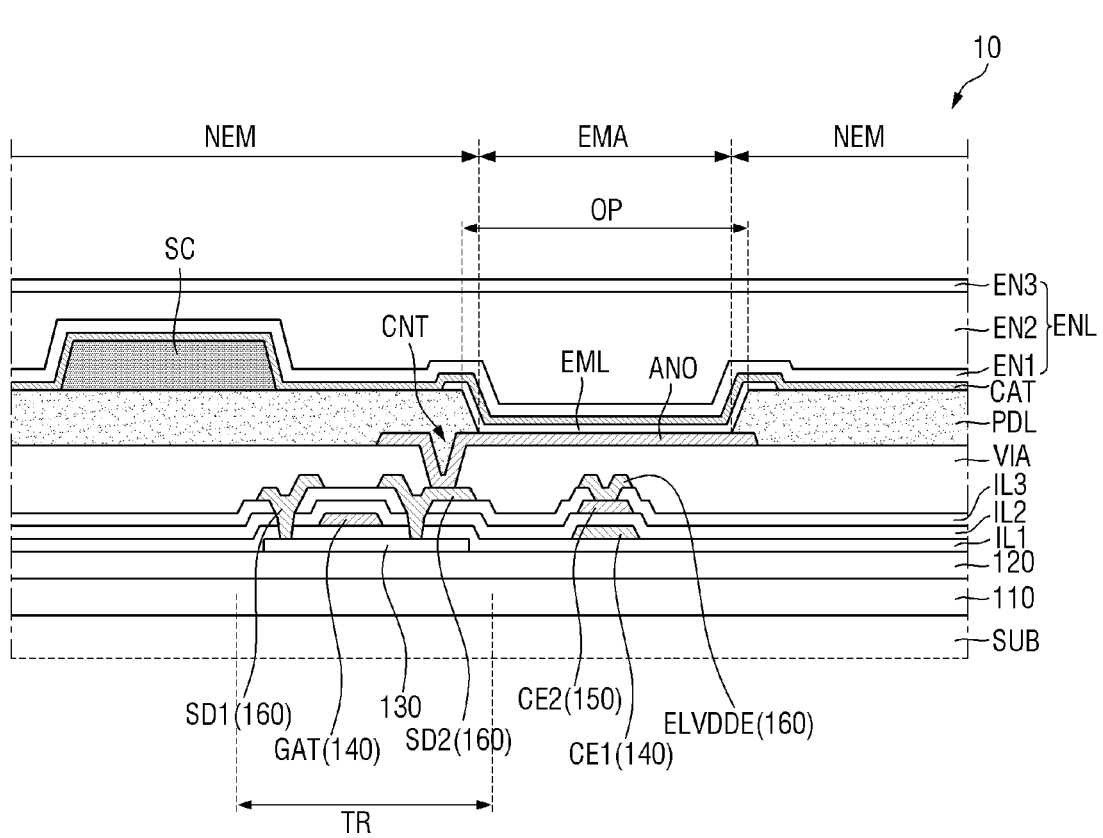
FIG. 9 is a cross-sectional view of a display panel according to an embodiment of the present disclosure.

FIG. 9 is a cross-sectional view of a display panel according to an embodiment of the present disclosure.

Referring to FIG. 9, the display panel 10 according to an embodiment of the present disclosure may include a plurality of pixels. Each of the pixels may include at least one thin-film transistor TR. The display panel 10 may include a substrate SUB, a barrier layer 110, a buffer layer 120, a semiconductor layer 130, a first insulating layer ILL a first gate conductive layer 140, a second insulating layer IL2, a second gate conductive layer 150, a third insulating layer IL3, a data conductive layer 160, a via layer VIA, an anode electrode ANO, a pixel-defining layer PDL defining an opening OP exposing the anode electrode ANO, a spacer SC disposed on the pixel-defining layer PDL, an emissive layer EML at least partially disposed in the opening OP of the pixel-defining layer PDL, a cathode electrode CAT disposed on the emissive layer EML and the pixel-defining layer PDL, and an encapsulation layer ENL disposed on the cathode electrode CAT. Each of the layers described above may be made up of a single film, or a stack of multiple films. Other layers may be further disposed between the layers.

The substrate SUB supports the layers disposed thereon. The substrate SUB may be made of an insulating material such as a polymer resin. Examples of the polymer material may include polyethersulphone (PES), polyacrylate (PA), polyacrylate (PAR), polyetherimide (PEI), polyethylene naphthalate (PEN), polyethylene terephthalate (PET), polyphenylene sulfide (PPS), polyallylate, polyimide (PI), polycarbonate (PC), cellulose triacetate (CAT), cellulose acetate propionate (CAP) or a combination thereof. It is, however, to be understood that the present disclosure is not limited thereto. The substrate SUB may be a transparent plate or a transparent film.

The substrate SUB may be a flexible substrate that may be bent, folded, or rolled. An example of the material of the flexible substrate may be, but is not limited to, polyimide (PI).

The barrier layer 110 is disposed on the substrate SUB. The barrier layer 110 may prevent impurity ions from diffusing, may prevent permeation of moisture or outside air, and may provide a flat surface. The barrier layer 110 may include or may be formed of at least one of silicon oxide (SiOx), silicon nitride (SiNx), and silicon oxynitride (SiOxNy). It is, however, to be understood that the present disclosure is not limited thereto. The barrier layer 110 may be eliminated depending on the type of the substrate SUB or process conditions.

The buffer layer 120 is disposed on the barrier layer 110. The buffer layer 120 may prevent impurity ions from diffusing, may prevent permeation of moisture or outside air, and may provide a flat surface. The buffer layer 120 may include or may be formed of silicon nitride (SiNx), silicon oxide (SiOx), or silicon oxynitride (SiOxNy). The buffer layer 120 may be eliminated depending on the type of the substrate SUB, process conditions, etc.

The semiconductor layer 130 is disposed on the buffer layer 120. The semiconductor layer 130 forms the channel of the thin-film transistor TR of the pixel. The semiconductor layer 130 may include or may be formed of polycrystalline silicon. It is, however, to be understood that the present disclosure is not limited thereto. The semiconductor layer 130 may include or may be formed of at least one of monocrystalline silicon, low-temperature polycrystalline silicon, amorphous silicon, and an oxide semiconductor. Alternatively, the semiconductor layer 130 may include or may be formed of an oxide semiconductor. For example, the oxide semiconductor may include or may be formed of at least one of indium-gallium-zinc oxide (IGZO), zinc-tin oxide (ZTO), indium-tin oxide (IZO), etc.

The first insulating layer IL1 is disposed on the semiconductor layer 130. The first insulating layer IL1 may be a first gate insulating film that has a gate insulating features. The first insulating layer IL1 may include or may be formed of at least one of a silicon compound and a metal oxide.

The first gate conductive layer 140 is disposed on the first insulating layer ILL The first gate conductive layer 140 may include a gate electrode GAT of the thin-film transistor TR of the pixel, a scan line connected thereto, and a first electrode CE1 of a storage capacitor.

The first gate conductive layer 140 may include or may be formed of at least one metal selected from the group consisting of: molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu).

A second insulating layer IL2 may be disposed on the first gate conductive layer 140. The second insulating layer IL2 may be an interlayer dielectric layer or a second gate insulating layer. The second insulating layer IL2 may include or may be formed of an inorganic insulating material such as silicon oxide, silicon nitride, silicon oxynitride, hafnium oxide, aluminum oxide, titanium oxide, tantalum oxide, and zinc oxide.

The second gate conductive layer 150 is disposed on the second insulating layer IL2. The second gate conductive layer 150 may include a second electrode CE2 of the storage capacitor. The second gate conductive layer 150 may include or may be formed of at least one metal selected from the group consisting of: molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) and copper (Cu). The second gate conductive layer 150 may be made of, but is not limited to, the same material as the first gate conductive layer 140.

The third insulating layer IL3 is disposed on the second gate conductive layer 150. The third insulating layer IL3 may be an interlayer dielectric film. The third insulating layer IL3 may include or may be formed of an inorganic insulating material such as silicon oxide, silicon nitride, silicon oxynitride, hafnium oxide, aluminum oxide, titanium oxide, tantalum oxide, and zinc oxide.

The data conductive layer 160 is disposed on the third insulating layer IL3. The data conductive layer 160 may include a first electrode SD1 and a second electrode SD2 of a thin-film transistor TR of a pixel, and a first voltage line ELVDDE of the display panel. The first electrode SD1 and the second electrode SD2 of the thin-film transistor TR may be electrically connected to the source region and the drain region of the semiconductor layer 130, respectively, through contact holes passing through the third insulating layer IL3, the second insulating layer IL2 and the first insulating layer ILL The first supply voltage line ELVDDE may be electrically connected to the second electrode CE2 of the storage capacitor through a contact hole penetrating through the third insulating layer IL3.

The data conductive layer 160 may include or may be formed of at least one metal selected from the group consisting of: aluminum (Al), molybdenum (Mo), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). The data conductive layer 160 may be made up of a single layer or multiple layers. For example, the data conductive layer 160 may have a stack structure of Ti/Al/Ti, Mo/Al/Mo, Mo/AlGe/Mo, or Ti/Cu.

The via layer VIA (or a planarization layer) is disposed on the data conductive layer 160. The via layer VIA covers the data conductive layer 160. The via layer VIA may include or may be formed of an organic insulating material. When the via layer VIA includes an organic material, it may have a flat upper surface despite the level differences thereunder.

The anode electrode ANO is disposed on the via layer VIA. The anode electrode ANO may be disposed on a surface VIAa of the via layer VIA. The anode electrode ANO may be a pixel electrode disposed in each of the pixels. The anode electrode ANO may be connected to the second electrode SD2 of the thin-film transistor TR through a contact hole CNT penetrating the via layer VIA. The anode electrode ANO may at least partially overlap the emission area EMA of the pixel.

The anode electrode ANO may have, but is not limited to, a stack structure of a material layer having a high work function such as indium-tin-oxide (ITO), indium-zinc-oxide (IZO), zinc oxide (ZnO) and indium oxide ($In_2O_3$), and a reflective material layer such as silver (Ag), magnesium (Mg), aluminum (Al), platinum (Pt), lead (Pb), palladium (Pd), gold (Au), nickel (Ni), neodymium (Nd), iridium (Ir), chromium (Cr), lithium (Li), calcium (Ca) or a mixture thereof. A layer having a higher work function may be disposed on a higher layer than a reflective material layer so that it may be closer to the emissive layer EML. The anode electrode ANO may have, but is not limited to, a multilayer structure of ITO/Mg, ITO/MgF, ITO/Ag, or ITO/Ag/ITO.

The pixel-defining layer PDL may be disposed on the anode electrode ANO. The pixel-defining layer PDL may be disposed over the anode electrode ANO and may include an opening OP exposing the anode electrode ANO. The opening OP may be defined by the pixel-defining layer PDL, and may penetrate the pixel-defining layer PDL in the thickness direction. The emission area EMA and the non-emission area NEM may be distinguished by the pixel-defining layer PDL and the opening OP thereof. The pixel-defining layer PDL may include or may be formed of an organic insulating material. It is, however, to be understood that the present disclosure is not limited thereto. The pixel-defining layer PDL may include or may be formed of an inorganic material.

The spacer SC may be disposed on the pixel-defining layer PDL. The spacer SC may protrude from at least a part of the pixel-defining layer PDL on one side (upper side) in the thickness direction. The spacer SC may serve to maintain a gap with elements disposed thereabove. Although not limited thereto, for example, the spacer SC may prevent defects such as dent on the display panel 10 by a fine metal mask (FMM). The spacer SC may include or may be formed of an organic insulating material like the pixel-defining layer PDL. Although not limited thereto, the spacer SC may be formed via the same process with the pixel-defining layer PDL.

The emissive layer EML may be disposed on the anode electrode ANO exposed by the pixel-defining layer PDL. The emissive layer EML may include or may be formed of an organic material layer. The organic material layer of the emission layer may include an organic emission layer. In some embodiment, the organic material layer of the emission layer may further include a hole injecting/transporting layer and/or an electron injecting/transporting layer.

The cathode electrode CAT may be disposed on the emissive layer EML. The cathode electrode CAT may be a common electrode disposed across the pixels. The anode electrode ANO, the emissive layer EML and the cathode electrode CAT may form an organic light-emitting element.

The cathode electrode CAT may include or may be formed of a material layer having a small work function such as Li, Ca, LiF/Ca, LiF/Al, Al, Mg, Ag, Pt, Pd, Ni, Au, Nd, Ir, Cr, BaF and Ba, or a compound or mixture thereof (e.g., a mixture of Ag and Mg). The cathode electrode CAT may further include a transparent metal oxide layer disposed on the material layer having a small work function.

The encapsulation layer ENL including a first encapsulation film EN1, a second encapsulation film EN2 and a third encapsulation film EN3 is disposed on the cathode electrode CAT. The first encapsulation film EN1 and the third encapsulation film EN3 may be in contact with each other at the end of the encapsulation layer ENL. The second encapsulation film EN2 may be encapsulated by the first encapsulation film EN1 and the third encapsulation film EN3.

Each of the first encapsulation film EN1 and the third encapsulation film EN3 may include or may be formed of an inorganic material. Although not limited thereto, the inorganic material may include or may be formed of, for example, silicon nitride, silicon oxide, or silicon oxynitride. The second encapsulation film EN2 may include or may be formed of an organic material. Although not limited thereto, the organic material may include or may be formed of, for example, an organic insulating material.

Hereinafter, other embodiments of the present disclosure will be described. In the following description, the same or similar elements will be denoted by the same or similar reference numerals, and redundant descriptions thereof will be omitted or briefly described. Descriptions will be made focusing on differences from the above embodiment.

Figure 10:
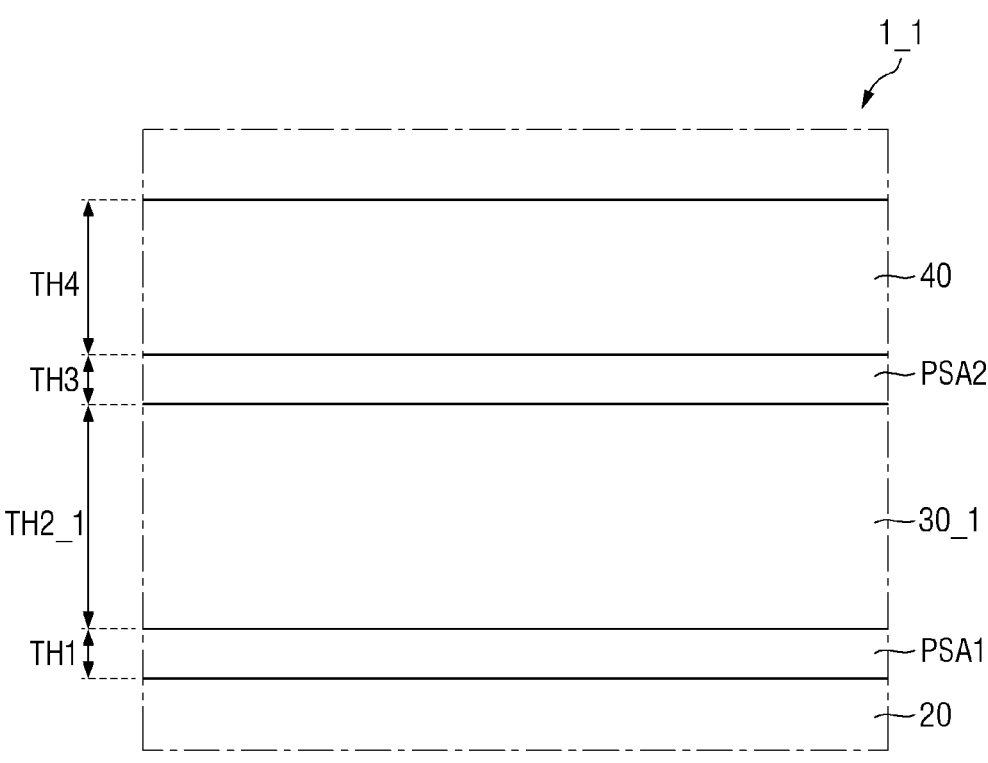
FIG. 10 is a cross-sectional view showing a part of a display device according to another embodiment of the present disclosure.

FIG. 10 is a cross-sectional view showing a part of a display device according to another embodiment of the present disclosure.

The embodiment of FIG. 10 is different from the embodiment of FIG. 4 in that a second thickness TH2_1 of a first protection member 30_1 of a display device 1_1 is greater than a fourth thickness TH4 of a second protection member 40. Although not limited thereto, the second thickness TH2_1 of the first protection member 30_1 may be, for example, in the range of from 0.01 μm to 750 μm, in the range of from 0.1 μm to 200 μm, or in the range of from 1 μm to 75 μm. Alternatively, the second thickness TH2_1 of the first protection member 30_1 may be, for example, in the range of from 0.01 μm to 1,000 μm, in the range of from 0.1 μm to 300 μm, or in the range of from 1 μm to 100 μm.

TABLE 3

| | Comparative Example 9 | Example 11 | Example 12 |
|---|---|---|---|
| Thickness of second protection member (μm) | 50 | 50 | 50 |
| Thickness of second adhesive member (μm) | 25 | 25 | 25 |
| Thickness of first protection member (μm) | 40 | 75 | 100 |
| Thickness of first adhesive member (μm) | 25 | 25 | 25 |
| Bright spot height (cm) | 2 | 5 | 6 |

Table 3 shows the results of measuring the height at which bright spots occur according to the thickness of the first adhesive member PSA1, the first protection member 30_1, the second adhesive member PSA2, and the second protection member 40. Herein, the height at which a bright spot occurs may refer to a height at which bright spot defects occur in the display device when an object is dropped from above the display device onto the display device. Therefore, it may be understood that the higher the height at which a bright spot occurs is, the greater the impact resistance is.

Comparative Example 9 may be substantially identical to the display device 1 (see FIG. 1) according to the embodiment of FIG. 4, and the thickness (the second thickness TH2) of the first protection member 30 (see FIG. 4) may be smaller than the thickness (the fourth thickness TH4) of the second protection member 40. In Examples 11 and 12, the thickness of the first protection member 30_1 (the second thickness TH2_1) is greater than the thickness of the second protection member 40 (the fourth thickness TH4).

Comparing Comparative Example 9 to Example 11 and Example 12, when the thickness of the first protection member 30_1 (the second thickness TH2_1) is greater than the thickness of the second protection member 40 (the fourth thickness TH4), the height at which a bright spot occurs is higher than when the thickness of the first protection member 30 (see FIG. 4) (the second thickness TH2 (see FIG. 4)) is smaller than the thickness of the second protection member 40 (the fourth thickness TH4). For example, when the thickness of the first protection member 30_1 (the second thickness TH2_1) is greater than the thickness of the second protection member 40 (the fourth thickness TH4), the impact resistance may be more improved than when the thickness of the first protection member 30 (see FIG. 4) (the second thickness TH2 (see FIG. 4)) is smaller than the thickness of the second protection member 40 (the fourth thickness TH4).

Comparing Example 11 to Example 12, when the thickness of the first protection member 30_1 (the second thickness TH2_1) is greater than the thickness of the second protection member 40 (the fourth thickness TH4), the height at which a bright spot occurs becomes higher as the thickness of the first protection member 30 (see FIG. 4) (the second thickness TH2 (see FIG. 4)) becomes larger. For example, when the thickness of the first protection member 30_1 (the second thickness TH2_1) is greater than the thickness of the second protection member 40 (the fourth thickness TH4), the impact resistance may be improved as the thickness of the first protection member 30 (see FIG. 4) (the second thickness TH2 (see FIG. 4)) becomes larger.

Even in this instance, the storage modulus of the second protection member 40 may increase according to an external impact, and thus the display device 1_1 may have both flexibility and impact resistance. Since the elastic modulus of the second adhesive member PSA2 is equal to or smaller than the elastic modulus of the first adhesive member PSA1, it is possible to suppress or prevent deterioration of the folding performance. As the thickness of the first protection member 30_1 (the second thickness TH2_1) is greater than the thickness of the second protection member 40 (the fourth thickness TH4), the impact resistance may be improved.

Figure 11:
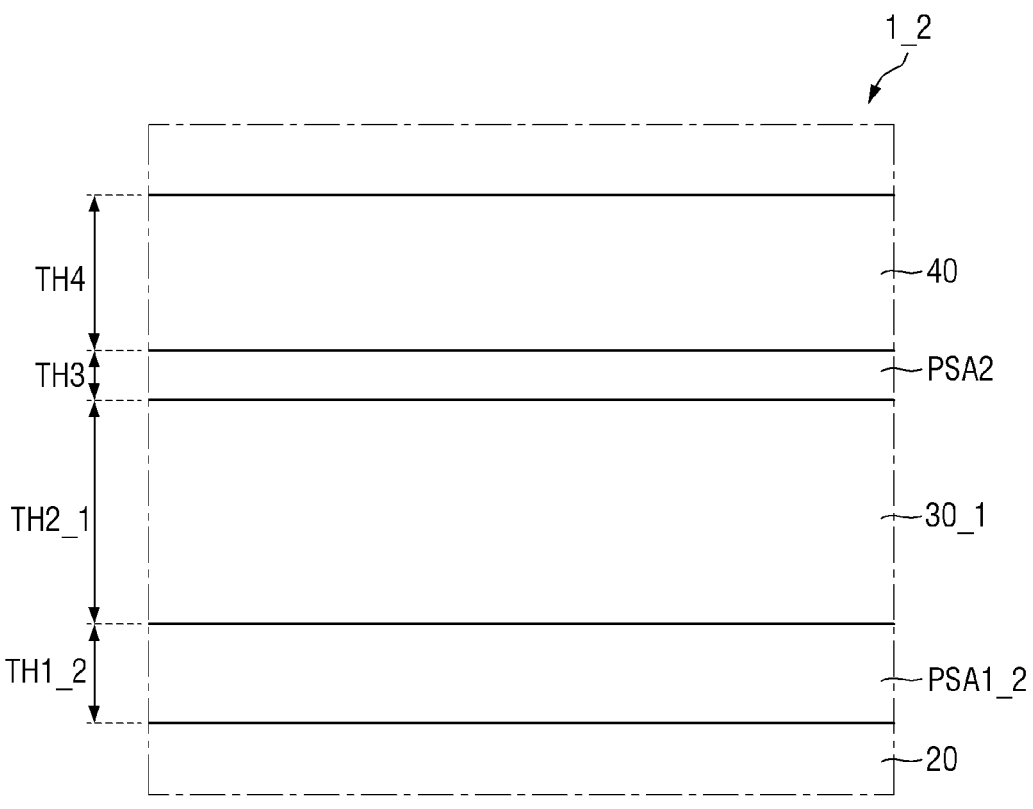
FIG. 11 is a cross-sectional view showing a part of a display device according to yet another embodiment of the present disclosure.

FIG. 11 is a cross-sectional view showing a part of a display device according to yet another embodiment of the present disclosure.

The embodiment of FIG. 11 is different from the embodiment of FIG. 10 in that a first thickness TH1_2 of a first adhesive member PAS1_2 of a display device 1_2 is greater than a third thickness TH3 of a second adhesive member PAS2. Although not limited thereto, the first thickness TH1_2 of the first adhesive member PSA_2 may be, for example, in the range of from 0.01 μm to 500 μm, in the range of from 0.1 μm to 150 μm, or in the range of from 1 μm to 50 μm.

TABLE 4

| | Comparative Example 10 | Example 13 |
|---|---|---|
| Thickness of second protection member (μm) | 50 | 50 |
| Thickness of second adhesive member (μm) | 25 | 25 |

20

TABLE 4-continued

| | Comparative Example 10 | Example 13 |
|---|---|---|
| Thickness of first protection member (μm) | 40 | 75 |
| Thickness of first adhesive member (μm) | 25 | 25 |
| Bright spot height (cm) | 5 | 8 |

Table 4 shows the results of measuring the height at which bright spots occur according to the thickness of the first adhesive member PSA1_2, the first protection member 30, the second adhesive member PSA2, and the second protection member 40.

Comparative Example 10 may be substantially identical to the display device 10_1 (see FIG. 10) according to the embodiment of FIG. 10, and the thickness (the first thickness TH1) of the first adhesive member PSA1 (see FIG. 10) may be smaller than the thickness (the third thickness TH3) of the second adhesive member PAS2 (see FIG. 10). In Example 13, the thickness of the first adhesive member PAS_2 (the first thickness TH1_2) is greater than the thickness of the second adhesive member PAS2 (the third thickness TH3).

Comparing Comparative Example 10 to Example 13, when the thickness of the first adhesive member PAS1_2 (the first thickness TH1_2) is greater than the thickness of the second adhesive member PSA2 (the third thickness TH3), the height at which a bright spot occurs is higher than when the thickness of the first adhesive member PSA1_2 (see FIG. 10) (the second thickness TH2 (see FIG. 10)) is equal to the thickness of the second adhesive member PSA2 (the third thickness TH3). For example, when the thickness of the first adhesive member PSA1_2 (the first thickness TH1_2) is greater than the thickness of the second adhesive member PAS2 (the third thickness TH3), the impact resistance may be more improved than when the thickness of the first adhesive member PSA1_2 (see FIG. 10) (the first thickness TH1 (see FIG. 10)) is smaller than the thickness of the second adhesive member PAS2 (the third thickness TH3).

Even in this instance, the storage modulus of the second protection member 40 may increase according to an external impact, and thus the display device 1_2 may have both flexibility and impact resistance. Since the elastic modulus of the second adhesive member PSA2 is equal to or smaller than the elastic modulus of the first adhesive member PSA1, it is possible to suppress or prevent deterioration of the folding performance. As the thickness of the first adhesive member PAS1_2 (the first thickness TH1_2) is greater than the thickness of the second adhesive member PAS2 (the third thickness TH3), the impact resistance may be improved.

Figure 12:
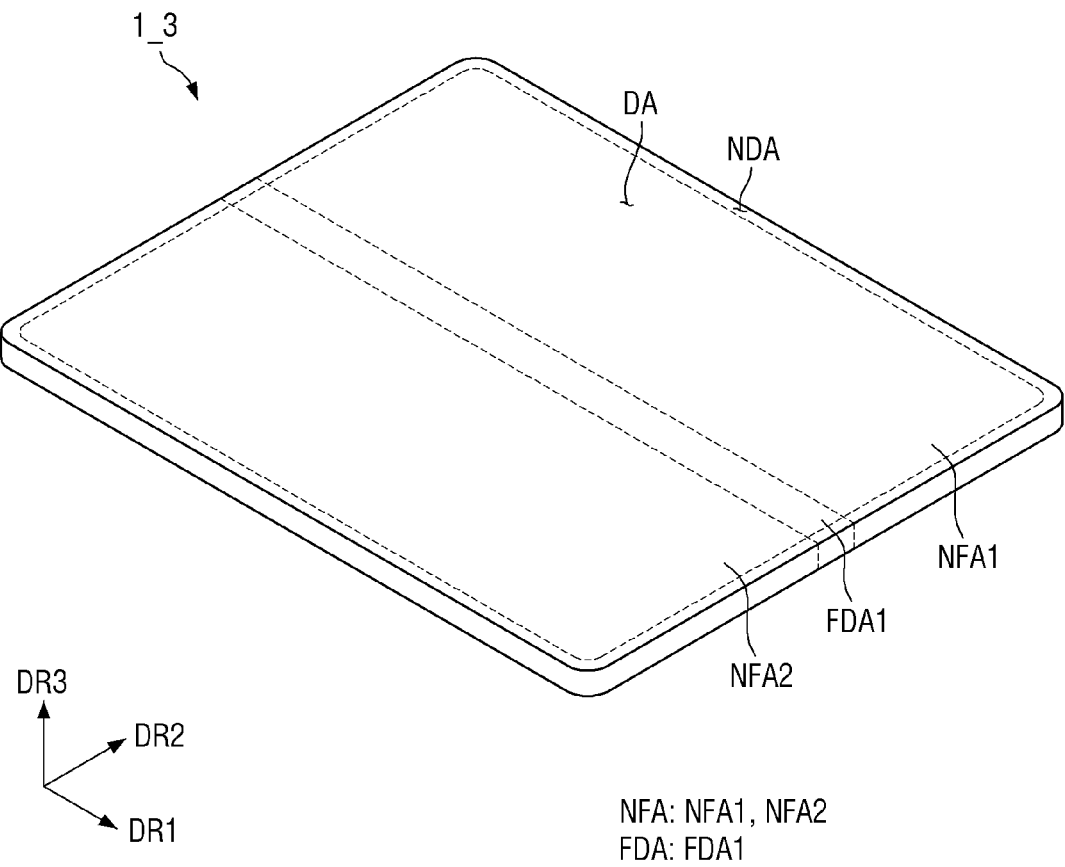
FIG. 12 is a perspective view of a display device according to yet another embodiment of the present disclosure when it is unfolded.
Figure 13:
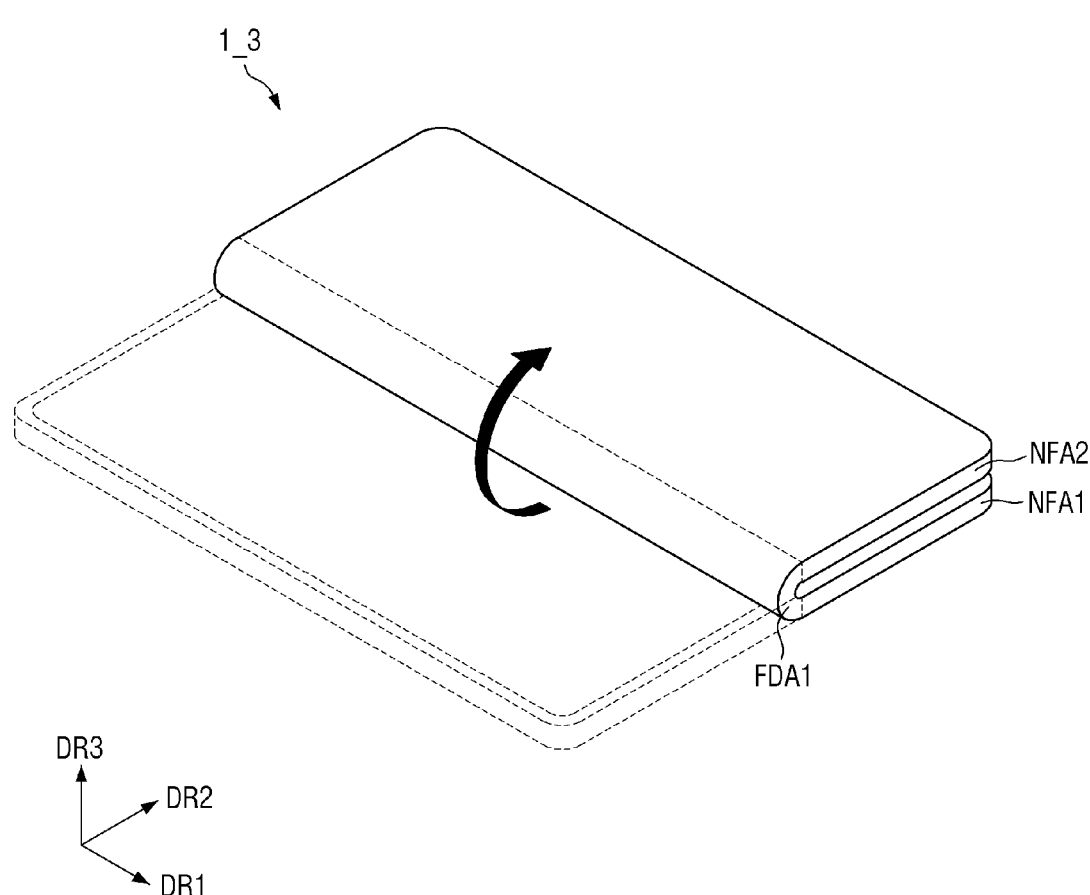
FIG. 13 is a perspective view showing the display device according to the embodiment of FIG. 12 when it is folded inward.
Figure 14:
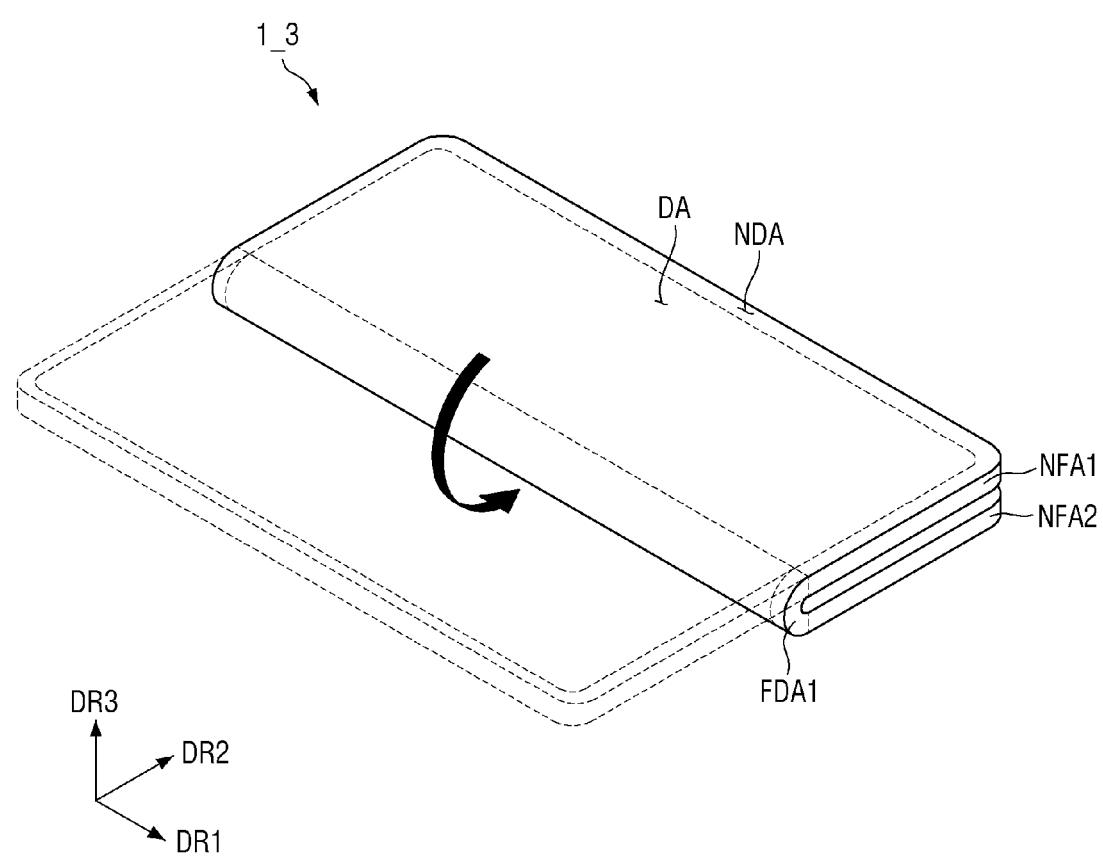
FIG. 14 is a perspective view showing the display device according to the embodiment of FIG. 12 when it is folded outward.

FIG. 12 is a perspective view of a display device according to yet another embodiment of the present disclosure when it is unfolded. FIG. 13 is a perspective view showing the display device according to the embodiment of FIG. 12 when it is folded inward. FIG. 14 is a perspective view showing the display device according to the embodiment of FIG. 12 when it is folded outward.

The embodiment of FIGS. 12 to 14 is different from the embodiment of FIG. 1 in that a display device 1_3 is folded inward and outward at the same folding area FDA. For example, the display device 1_3 may include a folding area FDA and non-folding areas NFA, and the display device 1_3 may include a first folding area FDA1, and a first non-folding area NFA1 and a second non-folding area NFA2 respectively disposed on one side and the opposite side of the first folding area FDA1 in the second direction DR2. For example, the first folding area FDA1 may be folded inward as shown in FIG. 13 and may be folded outward as shown in FIG. 14.

Even in this instance, the storage modulus of the second protection member 40 may increase according to an external impact, and thus the display device 1_3 may have both flexibility and impact resistance. Since the elastic modulus of the second adhesive member PSA2 is equal to or smaller than the elastic modulus of the first adhesive member PSA1, it is possible to suppress or prevent deterioration of the folding performance. A display device employing a variety of folding designs may be implemented as required by users.

In concluding the detailed description, those skilled in the art will appreciate that many variations and modifications may be made to the embodiments without substantially departing from the principles of the present disclosure. Therefore, the disclosed preferred embodiments of the invention are used in a generic and descriptive sense only and not for purposes of limitation.

What is claimed is:
1. A display device comprising folding areas, the display device comprising:
  a display panel;
  a first protection member disposed on the display panel;
  a second protection member disposed on the first protection member;
  a first adhesive member disposed between the display panel and the first protection member; and
  a second adhesive member disposed between the first protection member and the second protection member and having an elastic modulus smaller than an elastic modulus of the first adhesive member,
  wherein a thickness of the first adhesive member is smaller than a thickness of the second adhesive member of which modulus is smaller than the modulus of the first adhesive member.
2. The display device of claim 1,
  wherein the elastic modulus of the first adhesive member and the elastic modulus of the second adhesive member are measured by dynamic mechanical analysis.
3. The display device of claim 2,
  wherein the elastic modulus of the first adhesive member is greater than 0 kPa and less than 150 kPa at −20° C., and
  wherein the elastic modulus of the second adhesive member is greater than 0 kPa and less than 100 kPa at −20° C.
4. The display device of claim 1,
  wherein the first protection member has a first thickness, and
  wherein the second protection member has a second thickness different from the first thickness.
5. The display device of claim 1,
  wherein the folding areas may include a first folding area extended in a first direction and a second folding area extended in the first direction,
  wherein the first folding area and the second folding area are separated from each other in a second direction different from the first direction, and
  wherein the display device is folded inward along on the first folding area and folded outward along on the second folding area.

6. The display device of claim 5, further comprising:

a first non-folding area disposed at one side of the first folding area in the second direction;

a second non-folding area disposed between the first folding area and the second folding area; and a third non-folding area disposed at an opposite side of the second folding area in the second direction.

7. The display device of claim 6, further comprising:

a display area for displaying images; and a non-display area disposed outside the display area, wherein the display area and the non-display area are disposed across the first folding area, the second folding area, the first non-folding area, the second non-folding area and the third non-folding area.

8. The display device of claim 7, further comprising a first heat dissipation member and a second heat dissipation member under the display panel, wherein the first heat dissipation member is disposed at the first non-folding area and the second heat dissipation member is disposed at the second non-folding area and is separated from the first heat dissipation member.

9. The display device of claim 1, wherein a storage modulus of the second protection member increases with a frequency of an external impact applied to the second protection member.

10. The display device of claim 9, wherein the storage modulus of the second protection member according to the frequency increases more when the frequency of the second protection member is greater than 1 Hz than when the frequency of the second protection member is less than 1 Hz.

11. The display device of claim 10, wherein the storage modulus of the second protection member is in a range of from 6 GPa to 1,000 GPa when the frequency is 1 Hz, and is in a range of from 8 GPa to 1,000 GPa when the frequency is 30,000 Hz, and wherein the storage modulus of the second protection member is measured by dynamic mechanical analysis (DMA).

12. The display device of claim 9, wherein the second protection member includes at least one selected from the group consisting of: polyethylene terephthalate (PET), tri-acetyl cellulose (TAC), transparent polyimide and aramid.

13. The display device of claim 1, wherein a storage modulus of the first protection member lies in a range of from 1,000 MPa to 2,000 MPa at −20° C. and in a range of from 100 MPa to 2,000 MPa at 85° C.

14. A display device comprising a first folding area and a second folding area spaced apart from each other and extended in a first direction, the display device comprising:

a display panel;

a first protection member disposed on the display panel;

a second protection member disposed on the first protection member and having a storage modulus increasing with a frequency of an external impact applied to the second protection member;

a first adhesive member disposed between the display panel and the first protection member; and a second adhesive member disposed between the first protection member and the second protection member, wherein the display device is folded inward along the first folding area and folded outward along the second folding area, wherein an elastic modulus of the second adhesive member is smaller than an elastic modulus of the first adhesive member, and wherein a thickness of the first adhesive member is greater than a thickness of the second adhesive member of which modulus is smaller than the modulus of the first adhesive member.

15. The display device of claim 14, wherein the storage modulus of the second protection member according to the frequency increases more when the frequency of the second protection member is greater than 1 Hz than when the frequency of the second protection member is less than 1 Hz.

16. The display device of claim 15, wherein the storage modulus of the second protection member is in a range of from 6 GPa to 1,000 GPa when the frequency is 1 Hz, and is in a range of from 8 GPa to 1,000 GPa when the frequency is 30,000 Hz, and wherein the storage modulus of the second protection member is measured by dynamic mechanical analysis (DMA).

17. The display device of claim 14, wherein the second protection member includes at least one selected from the group consisting of: polyethylene terephthalate (PET), tri-acetyl cellulous (TAC), transparent polyimide and aramid.

18. The display device of claim 14, wherein the storage modulus of the first protection member lies in a range of from 1,000 MPa to 2,000 MPa at −20° C. and in a range of from 100 MPa to 2,000 MPa at 85° C.

19. A display device comprising a first folding area and a second folding area spaced apart from each other and extended in a first direction, the display device comprising:

a display panel;

a first protection member disposed on the display panel;

a second protection member disposed on the first protection member;

a first adhesive member disposed between the display panel and the first protection member; and a second adhesive member disposed between the first protection member and the second protection member, wherein a storage modulus of the first protection member lies in a range of from 1,000 MPa to 2,000 MPa at −20° C., and in a range of from 100 MPa to 2,000 MPa at 85° C., wherein an elastic modulus of the second adhesive member is smaller than an elastic modulus of the first adhesive member, and wherein a thickness of the first adhesive member is greater than a thickness of the second adhesive member of which modulus is smaller than the modulus of the first adhesive member.

* * * * *